US008238117B2

(12) United States Patent
Burwell et al.

(10) Patent No.: US 8,238,117 B2

(45) Date of Patent: *Aug. 7, 2012

(54) RACK MOUNTED ACCESS/SECURITY EXPANSION CONTROL PANEL

(75) Inventors: Robert A. Burwell, Kensington, NH (US); Andrew J. Pavlik, Raymond, NH (US)

(73) Assignee: Surveillance Specialties, Ltd., Wilmington, MA (US)

( * ) Notice: Subject to any disclaimer, the term of this patent is extended or adjusted under 35 U.S.C. 154(b) by 1060 days.

This patent is subject to a terminal disclaimer.

(21) Appl. No.: 12/046,981

(22) Filed: Mar. 12, 2008

(65) Prior Publication Data

US 2008/0205018 A1 Aug. 28, 2008

Related U.S. Application Data

(63) Continuation-in-part of application No. 11/857,743, filed on Sep. 19, 2007, now Pat. No. 7,696,872, which is a continuation-in-part of application No. 11/613,545, filed on Dec. 20, 2006.

(60) Provisional application No. 60/845,794, filed on Sep. 19, 2006.

(51) Int. Cl.
*H05K 7/14* (2006.01)

(52) U.S. Cl. ......................... 361/796; 361/788; 361/752

(58) Field of Classification Search .................. 361/796, 361/730, 752, 800, 728, 756, 788, 797; 718/100, 718/102; 709/248; 370/310, 345, 347, 348; 312/223.1–223.3; 340/539.31, 545.1, 547, 340/548, 568.3, 656, 679, 676; 360/39, 48, 69, 75, 78.01, 78.04, 78.14
See application file for complete search history.

(56) References Cited

U.S. PATENT DOCUMENTS

| | | | |
|---|---|---|---|
| 5,806,673 | A | 9/1998 | Sanderson |
| 5,854,904 | A | 12/1998 | Brown |
| 6,118,662 | A | 9/2000 | Hutchison et al. |

(Continued)

FOREIGN PATENT DOCUMENTS

WO WO-2008036326 A2 3/2008

OTHER PUBLICATIONS

Office Action issued Oct. 14, 2010 for U.S. Appl. No. 11/613,545, 11 pages.

(Continued)

*Primary Examiner* — Hung S Bui

(74) *Attorney, Agent, or Firm* — Nutter McClennen & Fish LLP; David J. Powsner; Christopher J. Stow

(57) ABSTRACT

The invention provides, in one aspect, an access control system that comprises an access control panel coupled to an access control expansion box. The access control panel includes one or more access control boards disposed within a first rack-mount enclosure, each control board providing at least an interface for monitoring and/or controlling access to one or more building entry points or zones via associated sensors and/or intrusion prevention devices, collectively, "security devices." The access control expansion box includes a plurality of input/output (I/O) boards disposed within a second rack-mount enclosure. The I/O boards provide an interface for at least (i) sending signals received from one or more additional security devices to the control boards, and/or (ii) sending signals received from the control boards to one or more of the additional security devices.

23 Claims, 10 Drawing Sheets

U.S. PATENT DOCUMENTS

| | | | | |
|---|---|---|---|---|
| 6,132,242 | A | 10/2000 | Hall et al. | |
| 6,347,963 | B1 | 2/2002 | Falkenberg et al. | |
| 6,452,809 | B1 | 9/2002 | Jackson et al. | |
| 6,697,258 | B1 | 2/2004 | Muhlfeld et al. | |
| 6,788,504 | B2 | 9/2004 | Vanderkolk | |
| 6,856,508 | B2 | 2/2005 | Rabinovitz | |
| 6,924,989 | B2 * | 8/2005 | Hall | 361/826 |
| 6,958,906 | B2 | 10/2005 | Wu et al. | |
| 7,230,791 | B1 | 6/2007 | Ostwald et al. | |
| 7,696,872 | B2 * | 4/2010 | Burwell et al. | 340/541 |
| 7,791,894 | B2 * | 9/2010 | Bechtolsheim | 361/752 |
| 2003/0051057 | A1 | 3/2003 | Garnett et al. | |
| 2004/0057202 | A1 | 3/2004 | Rabinovitz | |
| 2004/0233983 | A1 | 11/2004 | Crawford et al. | |
| 2007/0147013 | A1 | 6/2007 | Robbins et al. | |
| 2008/0068161 | A1 | 3/2008 | Burwell et al. | |
| 2008/0068783 | A1 | 3/2008 | Burwell et al. | |
| 2009/0231091 | A1 | 9/2009 | Burwell et al. | |

OTHER PUBLICATIONS

International Search Report & Written Opinion, PCT/US2007/020323, Mailed Mar. 25, 2008, 14 pages.

Office Action issued Sep. 21, 2009, for U.S. Appl. No. 11/613,545, 18 pages.

* cited by examiner

RACK MOUNTED ACCESS/SECURITY EXPANSION CONTROL PANEL

This is a continuation-in-part of commonly assigned U.S. patent application Ser. No. 11/857,743, filed Sep. 19, 2007, which itself is a continuation-in-part of U.S. patent application Ser. No. 11/613,545, filed Dec. 20, 2006, which claims the benefit of priority of U.S. Provisional Patent Application Ser. No. 60/845,794, filed Sep. 19, 2006, all of which are commonly assigned, and the teachings of all of which are incorporated herein by reference.

BACKGROUND OF THE INVENTION

The invention pertains to access/security control systems. It has application in the protection of buildings, homes, properties and people.

Access control typically refers to electromechanical security products/systems that monitor and control access in and out of buildings or other properties. Often, an access control system utilizes third party software to communicate with electronic panels that authorize a door to open, lock, be held, or any other combination of events through the use of electronic control hardware that is physically attached to the door.

The panels (referenced above) that are utilized for this process are typically wall-mounted in a centralized area (communications closet, security office, telephone room, etc.). Regardless of where the panels are physically located, the panels are connected to a computer server that controls access to each door by authorizing individuals with proper credentials to enter the space.

Literally, there are hundreds of companies that manufacture access control software and each of them manufactures their own access control panel that is intended to be wall-mounted. These manufacturer's also sell separately the circuit boards that are in a typical panel/enclosure as a "board only" component (i.e. sold without the wall mounted panel).

A typical security integrator buys "board only" components and mounts them in enclosures (e.g., provided by the components manufacturer) for wall-mounting. This often takes many hours and after mounting it takes many more hours in the field to make all of the connections.

Additionally, typical access control panels, e.g., of the type discussed above, are not easily expandable. A security integrator traditionally wall-mounts further "board only" components and connects each of them to the computer server (referenced above). This is a time consuming and, often inelegant, solution, as it can result in an array of exposed cables and circuit boards.

An object of the invention is to provide improved access control panels and methods.

A further object is to provide such panels and methods as speed and lower the cost of installation.

A still further object is to provide such panels and methods as can be used with control boards from multiple manufacturers.

A still further object is to provide such panels and methods as can be used in an IT environment (e.g., a computer room).

A still further object is to provide such panels and methods as can be easily extended.

SUMMARY OF THE INVENTION

The foregoing objects are among those attained by the invention which provides systems, apparatus and methods for access (or security) control that comprise, in some aspects, an access control panel in communications coupling with an access control expansion box. The access control panel includes one or more access control boards disposed within a first rack-mount enclosure, each control board providing at least an interface for monitoring and/or controlling access to one or more building entry points or zones via associated sensors and/or intrusion prevention devices, collectively, "security devices." The access control expansion box includes a plurality of input/output (I/O) boards disposed within a second rack-mount enclosure. The I/O boards provide an interface for at least (i) sending signals received from one or more additional security devices to the control boards, and/or (ii) sending signals received from the control boards to one or more of the additional security devices.

In a related aspect, the invention provides an access control system as described above in which at least one connector is disposed or mounted on the first enclosure providing communications coupling between at least one of the control boards and at least one of the I/O boards. In a related aspect of the invention, the connector provides such coupling without requiring that a field technician, or other person installing the system at a site, pass wire through the first enclosure in order to establish that communications coupling.

In another aspect, the invention provides, an access control system as described above in which at least one connector is disposed or mounted on the second enclosure providing communications coupling between at least one of the I/O boards and at least one of the additional security devices. In a related aspect of the invention, the connector provides such coupling without requiring that a field technician, or other person installing the system at a site, pass wire through the second enclosure in order to establish that communications coupling.

In another aspect of the invention, an access control system as described above includes at least one connector is disposed or mounted on the second enclosure providing communication coupling between at least one of the I/O boards disposed within that second enclosure and at least one of the control boards disposed within the first enclosure. In a related aspect of the invention, such a connector consolidates a plurality of signals received by the I/O boards for transmission to one or more of the control boards disposed within the first enclosure.

Further related aspects of the invention provide an access control system as described above that includes a wiring harness disposed within the first enclosure that carries communications signals from the one or more connectors to the control boards.

Still further related aspects of the invention provide such an access control system that includes a wiring harness disposed within the second enclosure to provide signal coupling between the one or more connectors of that enclosure to the I/O boards.

These and other aspects of the invention are evident in the drawings and text that follows.

DETAILED DESCRIPTION OF THE ILLUSTRATED EMBODIMENT

Figure 1:
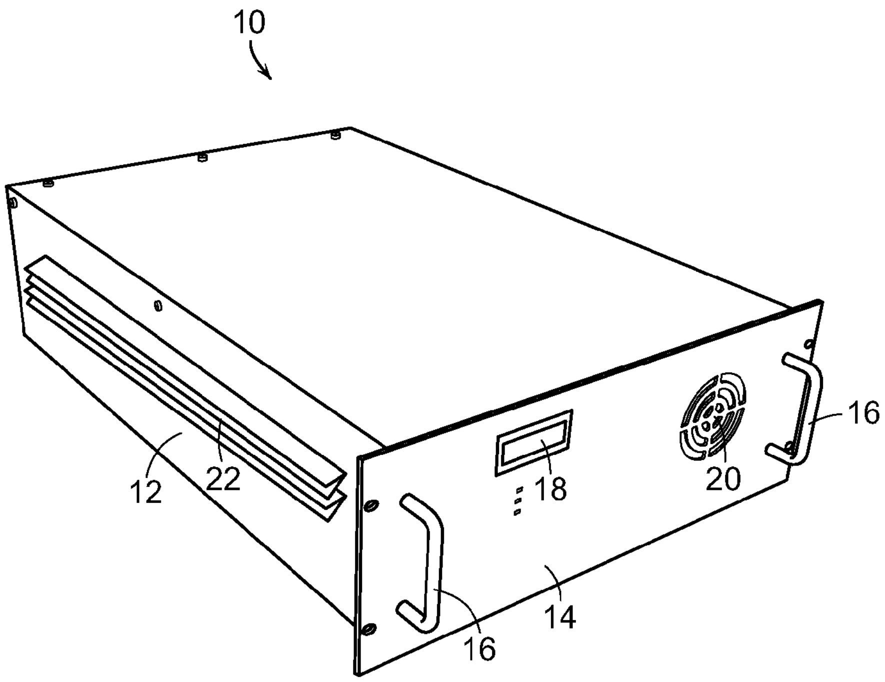
FIG. 1 depicts a rack-mounted access control panel according to one practice of the invention.

FIG. 1 depicts a rack-mounted access control panel 10 according to one practice of the invention. The panel 10 includes an enclosure 12 having a front panel 14, as shown. The enclosure 12 provides a rigid framework onto which mechanical, electromechanical, integrated circuit and other components (collectively, "components") of the panel 10 are mounted and a housing structure that protects those components from dust, moisture, tampering, and so forth. In the illustrated embodiment, enclosure 12 comprises a metal rack-mount chassis of the type conventionally used in the digital data processor server art, the laboratory equipment art, and so forth. Illustrated enclosure 12 is composed of metal and has a height of 4U, though, in other embodiments it may have a different height (e.g., 2U), and it may be composed of plastic, ceramic, composite, or otherwise.

The illustrated front panel 14 is affixed to a front of enclosure 12, as shown. The panel 14, which contributes to mounting and protection of the components of the rack-mount access control panel 10, also facilitates handling and rack-mounting of the panel 10, as well as operator interpretation of panel 10 status. To these ends, illustrated panel 10 incorporates handles 16, a display 18, air flow apertures 20, and slides 22, configured as shown. The handles 16 and slides 22 facilitate sliding of the panel 10 in and out of a rack (not shown), e.g., a standard EIA twenty six inch deep electronics rack, or otherwise. Display 18 displays the status of access control panel 10 and, in the illustrated embodiment, comprises a conventional LCD display of the type known in the art, though in other embodiments it may be of a different type (e.g., LED display). Air flow apertures 20 ensure a stable operating temperature within the enclosure 12 and, in the illustrated embodiment, comprise conventional openings in the front panel 14. One or more fans could, for example, circulate air through such openings, thereby cooling the components inside enclosure 12.

Figure 2:
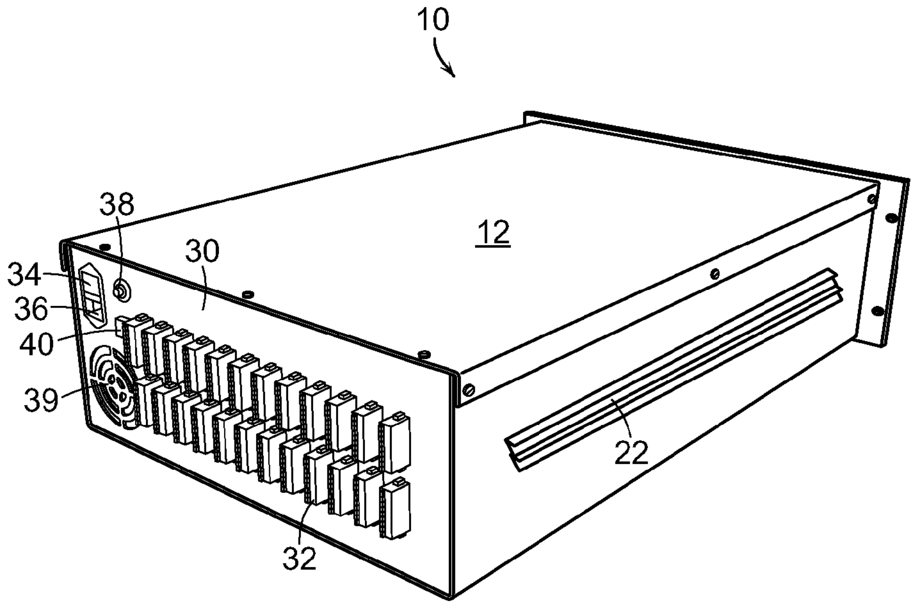
FIG. 2 depicts a rear panel of the enclosure of FIG. 1 and, specifically, depicts a rear panel having multiple connectors.

FIG. 2 depicts a rear-view of the rack-mounted access control panel 10 of FIG. 1. The access control panel 10 includes a rear panel 30 affixed to a rear of the enclosure 12, as shown. The illustrated rear panel 30 has multiple connectors 32 (as described below), a power switch 34, a power-in port 36, a circuit breaker 38, air flow apertures 39, and a LAN (local area network) port 40, configured as shown. The power switch 34 allows a user to control the flow (e.g., "on" or "off") of electrical power to the access control panel 10 and, in the illustrated embodiment, comprises a conventional toggle switch or otherwise. Illustrated power switch 34 is operated manually, though, in other embodiments it may be operated electronically, remotely, or otherwise.

The power-in port 36 serves as an interface between the access control panel 10 and an external power source. In the illustrated embodiment, power-in port 36 comprises an electrically wired outlet, into which a conventional power plug or cable connects.

The circuit breaker 38 protects the components mounted inside (or outside) enclosure 12 from damage caused by overload or short circuit and, in the illustrated embodiment, comprises a conventional circuit breaker of the type conventionally used in the art. Illustrated circuit breaker 38 is disposed on the rear panel 30, though, in other embodiments it may be disposed on the front panel or other portion of enclosure 12. Still other embodiments may obviate the need for such a circuit breaker 38, e.g., by building such functionality into individual components.

The air flow apertures 39 operate in the same manner as the apertures 20 described above. Illustrated air flow apertures 39 are disposed on the left side of the rear panel 30, though, in other embodiments they may be disposed elsewhere.

The LAN port 40 serves as an interface between the access control panel 10 and an IP network (not shown), e.g., a switched IEEE 802.3 Ethernet network, or otherwise, via which panel 10 may be monitored or controlled and/or to which one or more of the sensors, actuators, intrusion prevention devices and other apparatus (collectively "security devices") monitored/controlled by the panel 10 may be coupled. In the illustrated embodiment, LAN port 40 comprises a standard Ethernet port into which an RJ-45 plug or cable connects, though, in other embodiments this may be supplemented and/or replaced with an interface to any variety of wired or wireless networks (e.g., 802.11x, or otherwise).

Figure 3:
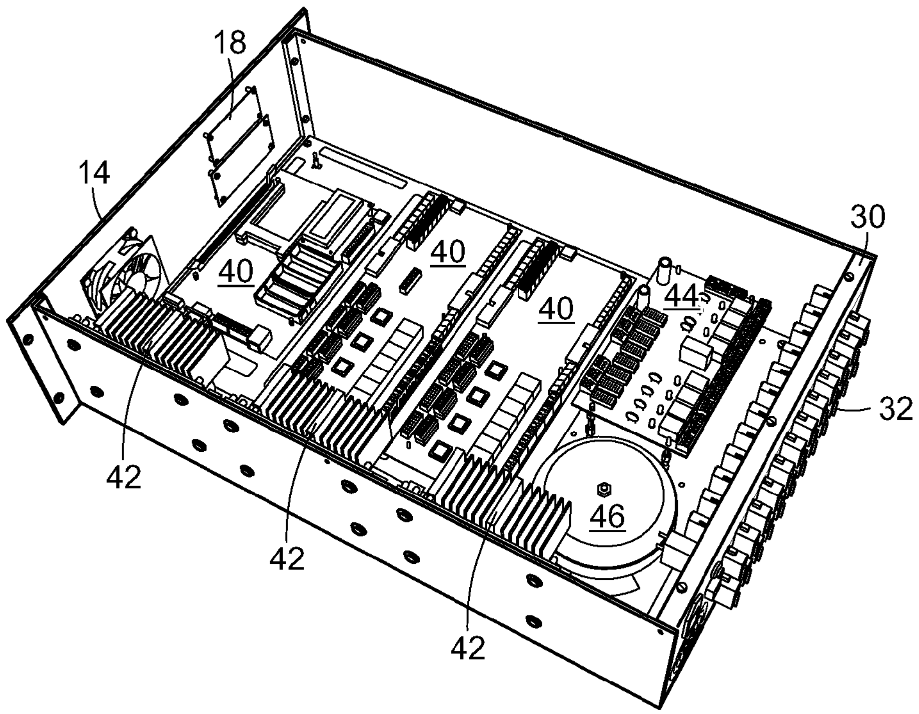
FIG. 3 depicts the internals of the access control panel of FIG. 1.

FIG. 3 depicts the internals of the access control panel 10 of FIG. 1. The panel 10 has components mounted on a base of enclosure 12 and rear panel 30, as shown. The illustrated components include access control boards 40, power supplies 42, power distribution board 44, an array of connectors 32 (discussed below in reference to FIG. 4), and a transformer 46, configured as shown. The access control boards 40 provide an interface for monitoring and/or controlling access to one or more building entry points or zones via associated security devices. By way of non-limiting example, such security devices can include door status contacts, motion detectors, glass break detectors, etc., and actuators, e.g., lights, alarms, locks, etc., although more complicated devices can be served as well. In the illustrated embodiment there are three access control boards 40 disposed within enclosure 12, each of the type conventionally used in the art of access control. Other embodiments may include a greater or lesser number of such boards 40, and/or combine the functionality of the control boards 40 with others of the illustrated components.

With further reference to FIG. 3, the illustrated access panel 10 includes three power supplies 42, a power distribution board 44, and a transformer 46, that, together, supply power to the control boards 40 in the conventional manner known in the art. Illustrated transformer 46 is torroidal in shape, though other configurations can be used, and it powers the panel 10 itself and attached security devices (for example, magnetic locks, sensors, etc.), e.g., via DC power supplies 42 or otherwise. Likewise, power distribution board 44 is implemented in printed circuit boards, though other form factors can be used. Moreover, although power supplies 42, power distribution board 44, and transformer 46, are shown separately, in some embodiments, their functionality may be combined and/or distributed among other components of the access panel 10.

Figure 4:
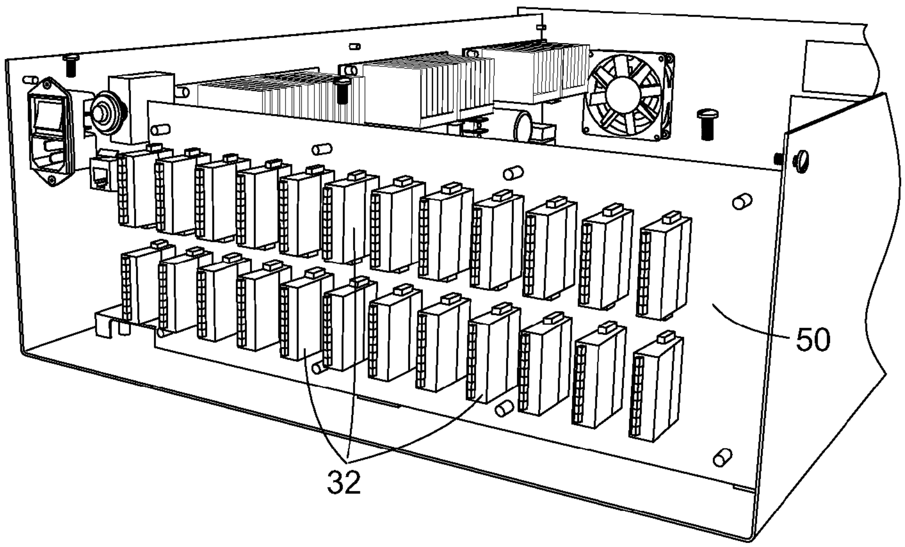
FIG. 4 depicts a circuit board that is integral to the rear panel shown in FIG. 4 on which the connectors are mounted.

FIG. 4 depicts a circuit board 50 integral to the rear panel 30 of panel 10 of FIG. 1. The illustrated circuit board 50 has connectors 32, electrically and mechanically coupled thereto and configured as shown.

Illustrated connectors 32 provide communications coupling, e.g., electrical connectivity, between the control boards 40 (via circuit board 50 and wiring harness 82 discussed below) and the aforementioned security devices (e.g., detectors, electrified locks, etc.). Additionally, the connectors 32 provide communications coupling between the control boards 40 and any expansion boxes and/or I/O boards, as discussed further below.

In the illustrated embodiment, each connector 32 has multiple conductors and screws, fast-locks, or other fastening devices that facilitate securing corresponding leads from cabling that lead to those security devices—and, thereby, establishing electrical connectivity to the control boards (again, via the circuit board and wiring harness).

To this end, connectors 32 can be selected or configured for securing leads to conventional analog or digital security devices. An advantage of utilization of connectors 32 (rather than wire pass-through apertures of the type incorporated in most prior-art security panels) is that the field technician, or other person installing the panel 10 at a site, can simply attach leads from the security devices to the connectors (rather than passing those leads through the panel) in order to establish coupling between the control boards 40 and those security devices.

Figure 5:
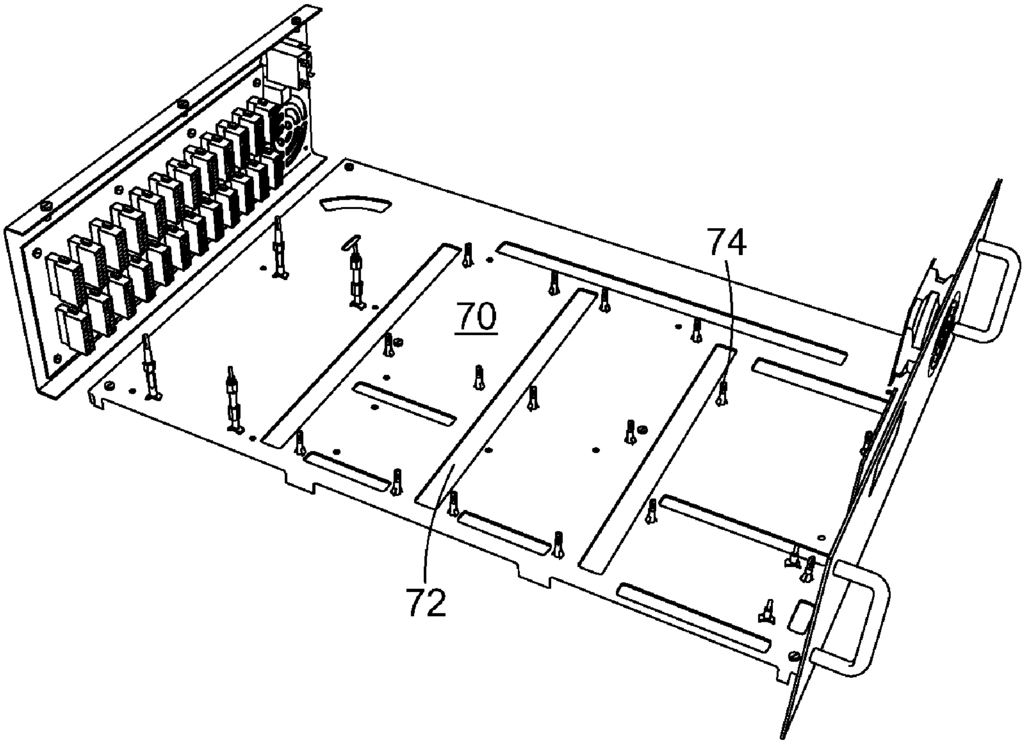
FIG. 5 is a detailed view of the backplane of the access control panel of FIG. 1.

FIG. 5 depicts a backplane 70 of the panel 10 of FIG. 1. Backplane 70 provides for electrical grounding and physical mounting of access control boards 40. In the illustrated embodiment, it includes mount points (e.g., screw holes, mount pins, etc.) for access control boards of multiple different manufacturers, though, other embodiments may support a limited variety of such boards. Illustrated backplane 70 comprises stamped metal piecework, though, in other embodiments it comprise printed circuit boards or other fabrications.

Figure 6:
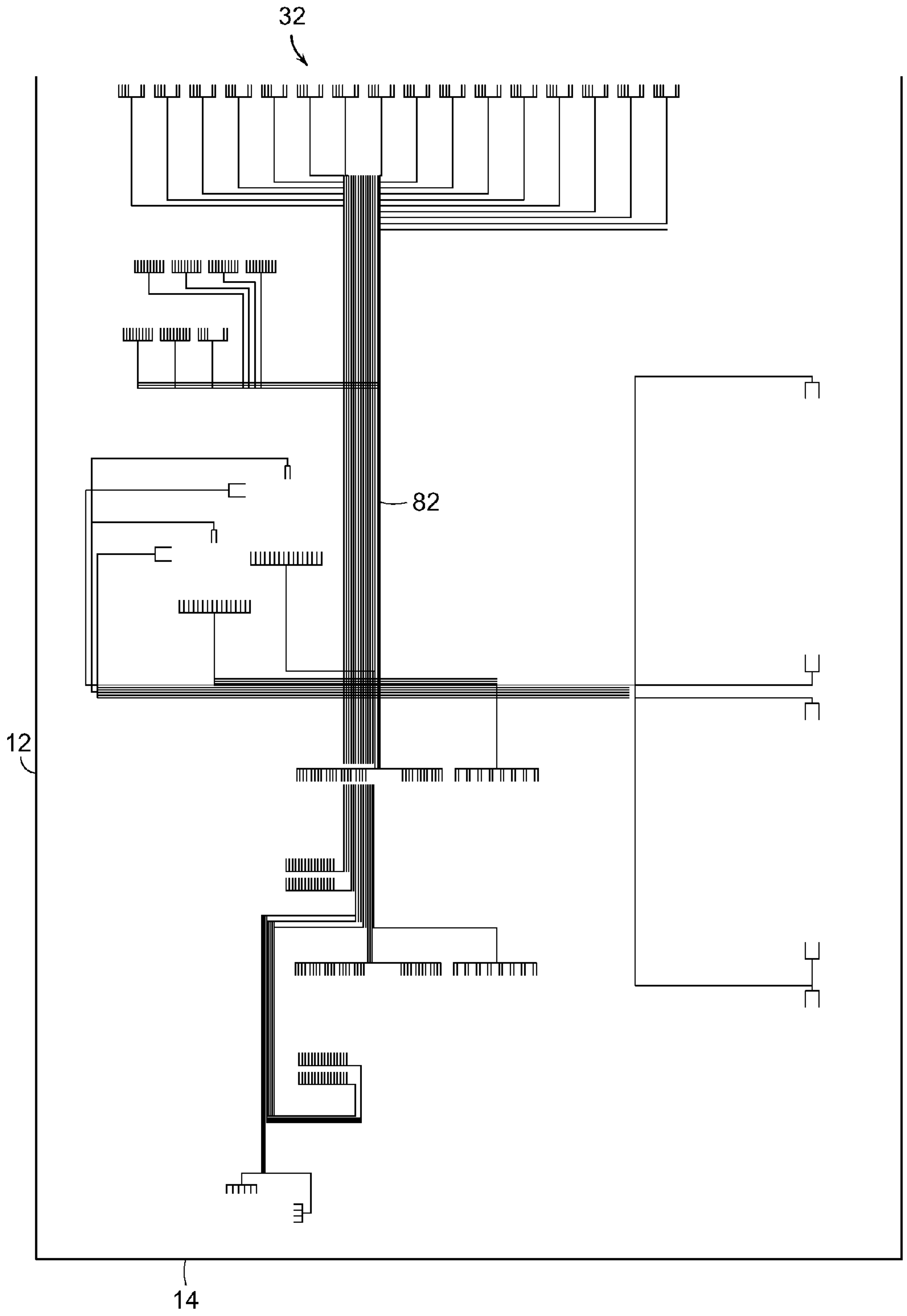
FIG. 6 depicts a physical diagram of the wiring harness used in the access control panel of FIG. 1.

FIG. 6 depicts a physical diagram of a wiring harness 82 for use in the security panel 10 of FIG. 1. The illustrated harness 82 provides electrical coupling and/or communications coupling between each of the connectors 32 and their respective control boards 40. In the illustrated embodiment, harness 82 comprises an arrangement of one or more bundled wires fabricated in the conventional manner known in the art as adapted in accord with the teachings hereof. Though a wire bundle is used in the illustrated embodiment, other embodiments may use flexible circuit boards and so forth.

Figure 7:
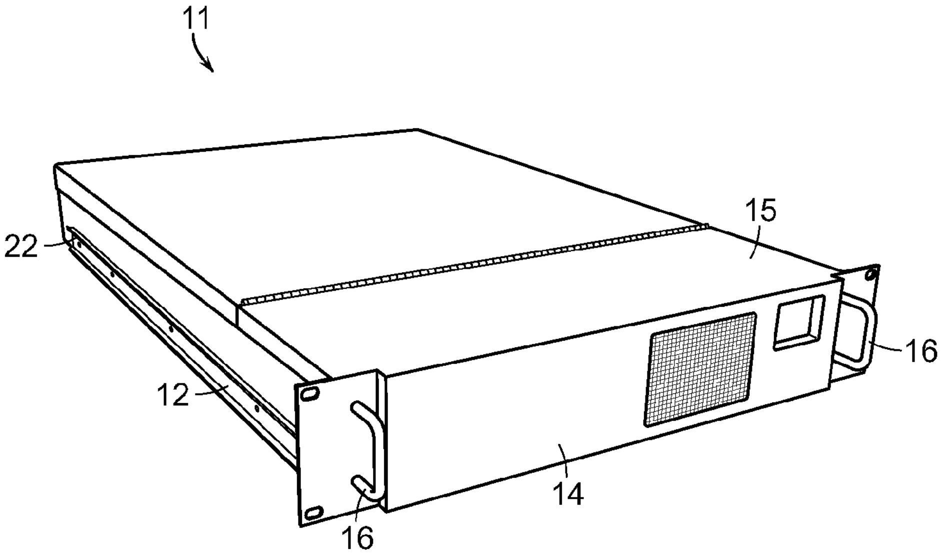
FIG. 7 depicts a 2U rack-mounted access control panel according to one practice of the invention.

FIG. 7 depicts a rack-mounted access control panel 11 according to a further practice of the invention. It is generally configured and operated in the manner of the rack-mounted access control panel 10, discussed above. Additional aspects of the control panel 11 are detailed in the text that follows, in which element numbers are re-used from prior drawings to designate components similar to those discussed above.

The control panel 11 includes an enclosure 12, generally configured as described above, although in this embodiment (of FIG. 7) it has a height of 2U—though, as above, it may be of a different height. The illustrated panel 11 additionally includes a hinged access port 15 located on a top, front portion of the enclosure 12, as shown. In other embodiments, the access port 15 may be located elsewhere and may be secured by mechanism(s) other than hinges. The hinged port 15 allows, among other things, easy access to the internals of the panel 11.

Unlike control panel 10, panel 11 does not include a fan (e.g., for the reasons discussed below) nor does it include an LCD screen; although in other embodiments, such components may be present.

Figure 8:
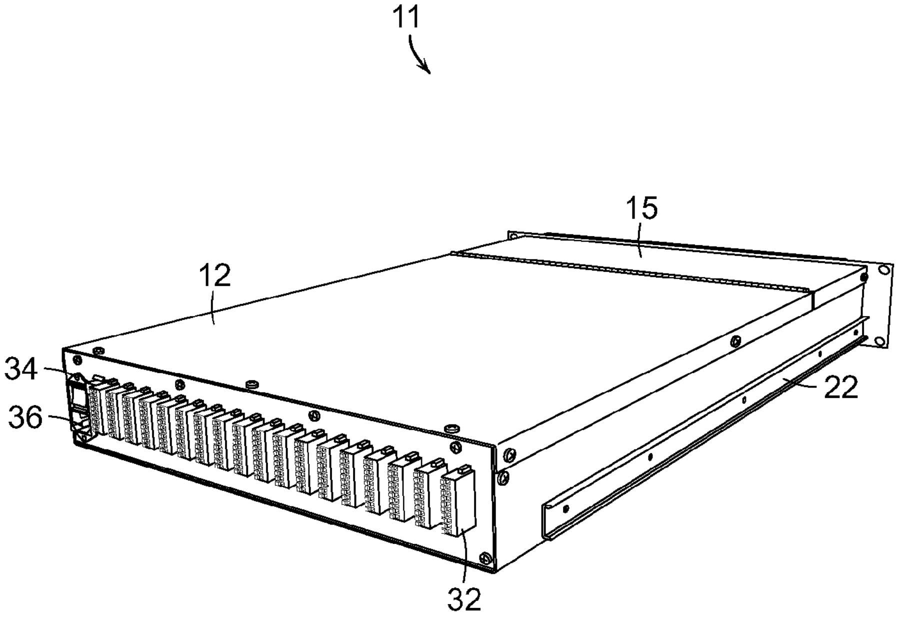
FIG. 8 depicts a rear panel of the enclosure of FIG. 7 and, specifically, depicts a rear panel having multiple connectors.

FIG. 8 depicts a rear view of the rack-mounted access control panel 11 of FIG. 7. In this embodiment, there is a single row of connectors 32 (unlike the dual row of the embodiment discussed above). Additionally, the panel 11 includes two LAN ports 36, although, in the illustrated embodiment, both LAN ports 36 are not simultaneously active (though, in other embodiments, they may be). The dual LAN ports provide, among other things, redundancy: the operator, field technician, or other person maintaining the panel 11 may switch a LAN cable from one port to the other in event of failure. Also, although not shown above, panel 10 may include such a dual LAN port configuration.

The illustrated panel 11 also includes a removable shroud (not shown) at a rear portion of the enclosure 12. The shroud, among other things, protects the cables and connectors 32 from dust, debris, or other hazards (e.g., incurred while mounted in the rack). In this embodiment, the shroud is affixed to the rear of the panel 11 with screws, and has an open bottom that allows for cabling to be attached to the connectors 32, although in other embodiments, it may be configured otherwise.

Figure 9:
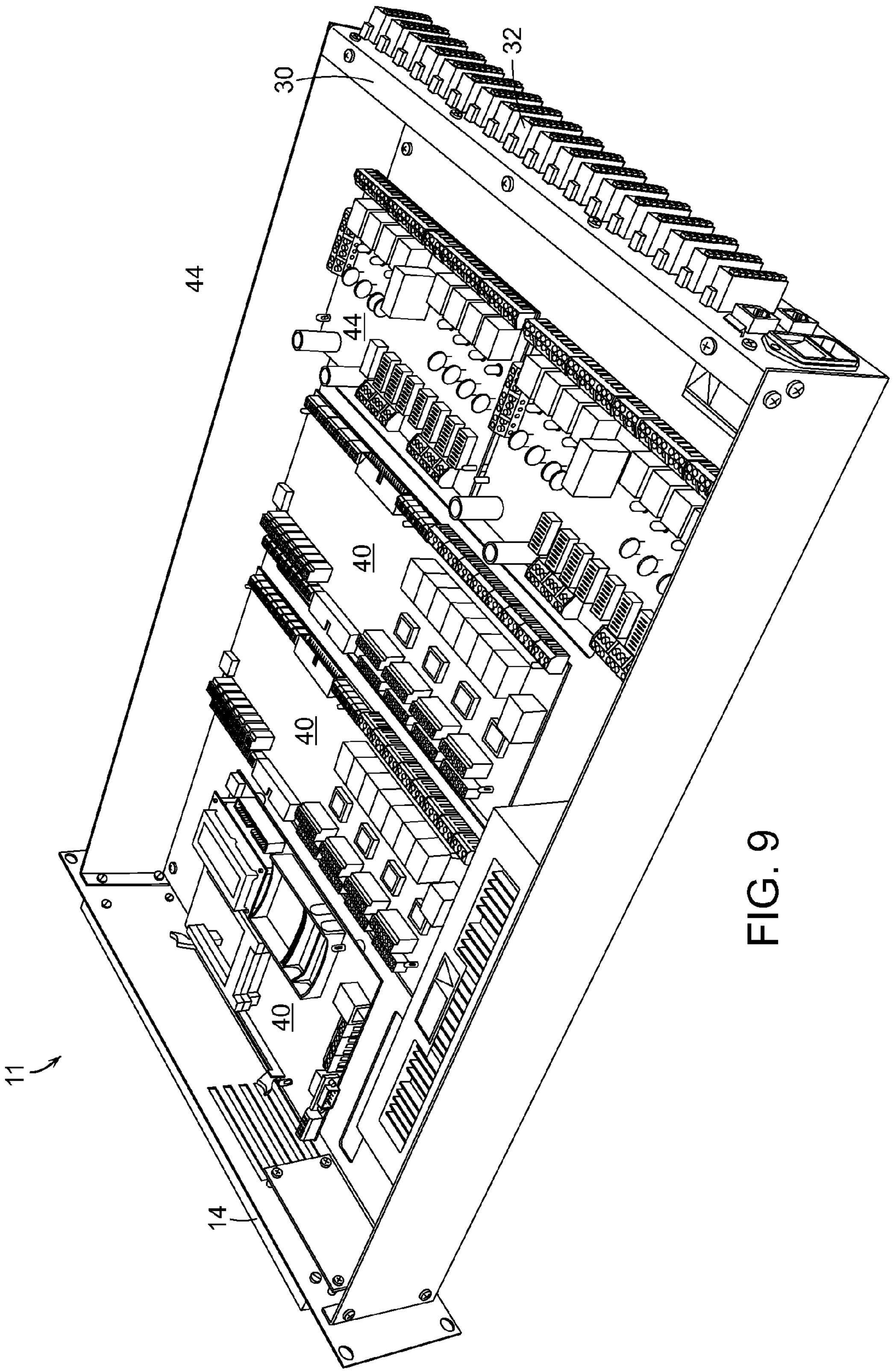
FIG. 9 depicts the internals of the access control panel of FIG. 7.

FIG. 9 depicts the internals of the access control panel 11 of FIG. 7. The transformer in this embodiment provides step-down power to a single power supply which provides power only for the panel 11 itself and not for any security devices (e.g., magnetic locks, sensors, etc.) This has the advantage, among other things, of generating lower temperatures within the panel 11, thereby removing the need for a fan. As with the embodiment discussed above, the transformer may be powered by an external UPS (not shown).

Figure 10:
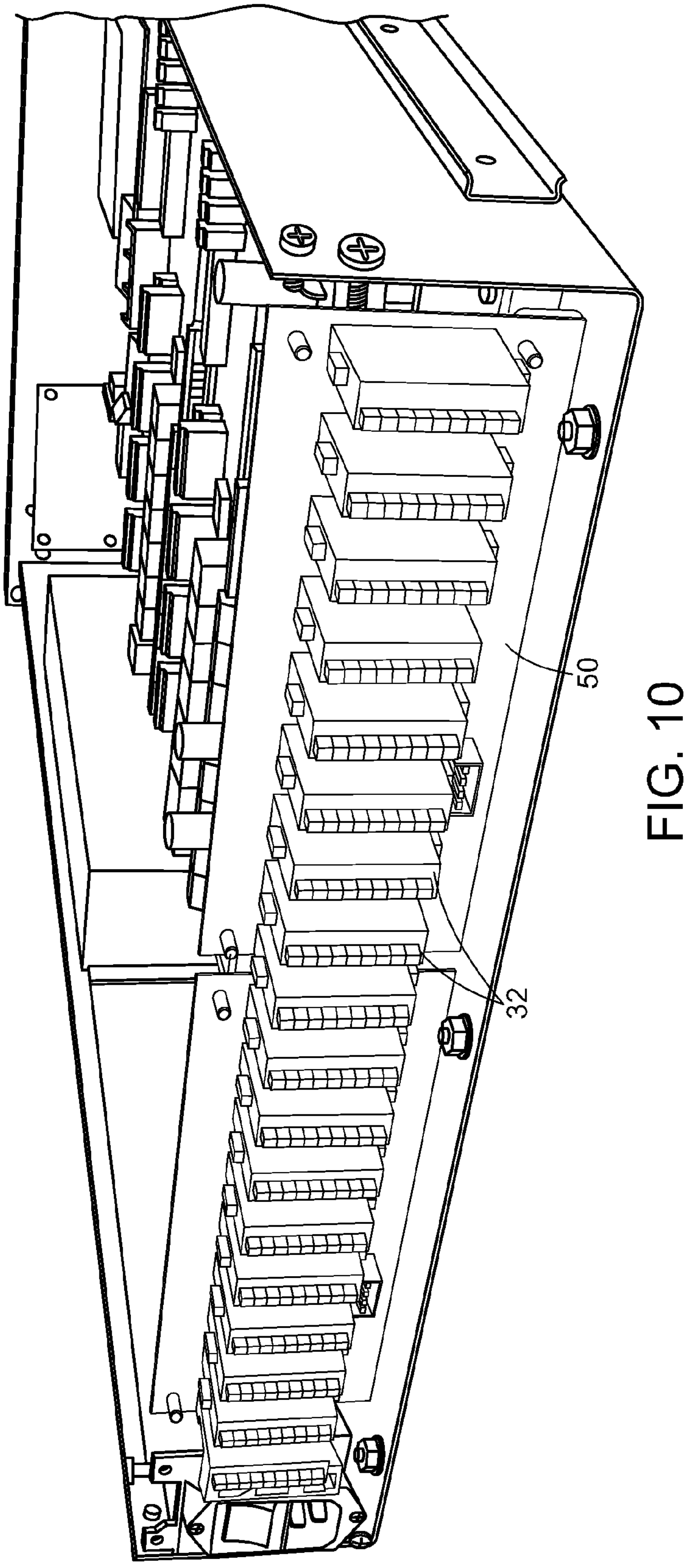
FIG. 10 depicts a circuit board that is integral to the rear panel shown in FIG. 9 on which the connectors are mounted.

FIG. 10 depicts a circuit board 50 integral to the rear panel 30 of control panel 11 of FIG. 7. That board 50 is generally configured and operated as described above in connection with FIG. 4.

Figure 11:
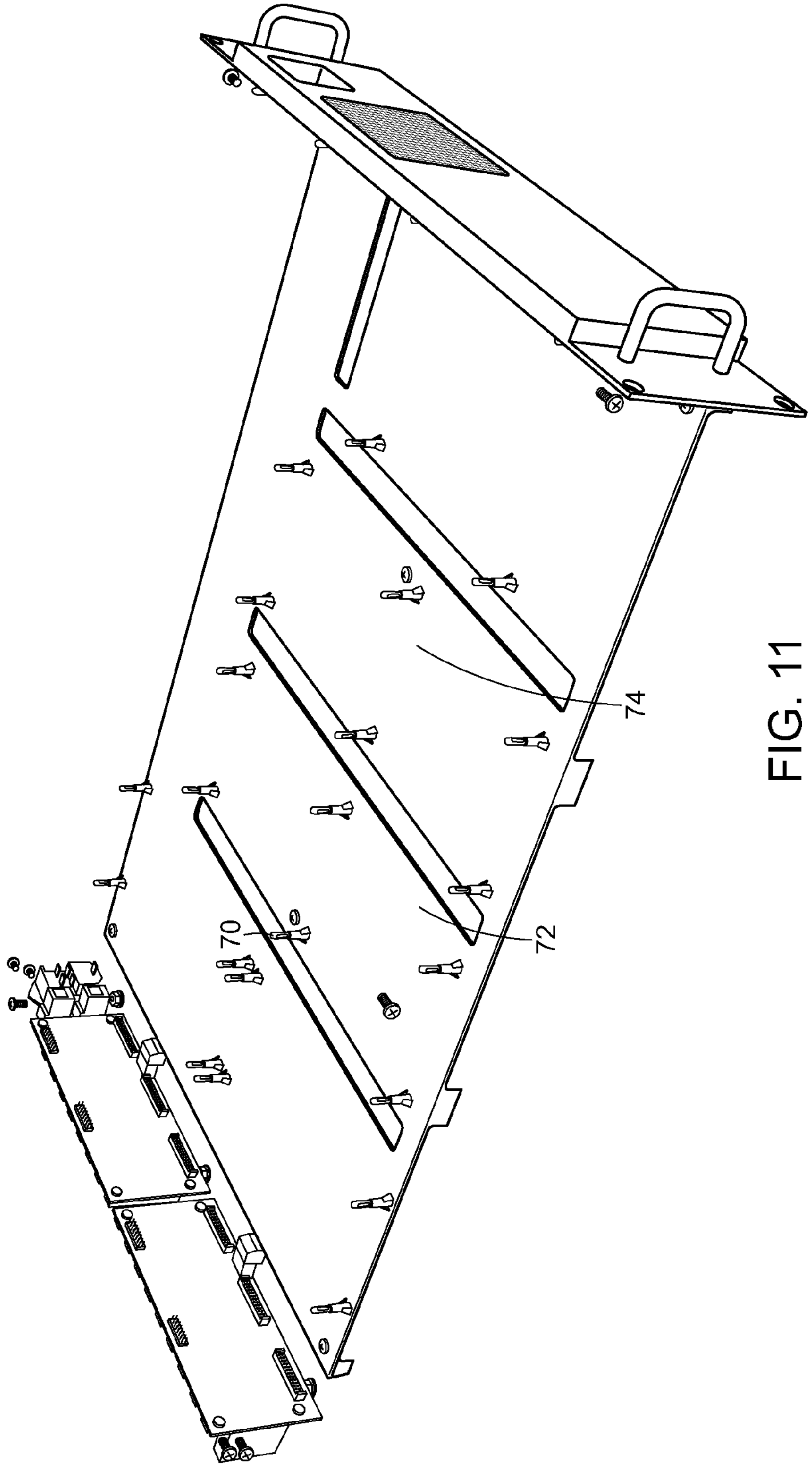
FIG. 11 is a detailed view of the backplane of FIG. 10.

FIG. 11 depicts a backplane 70 of the control panel 11 of FIG. 7. That backplane 70 is generally configured as described above in connection with FIG. 5.

Figure 12:
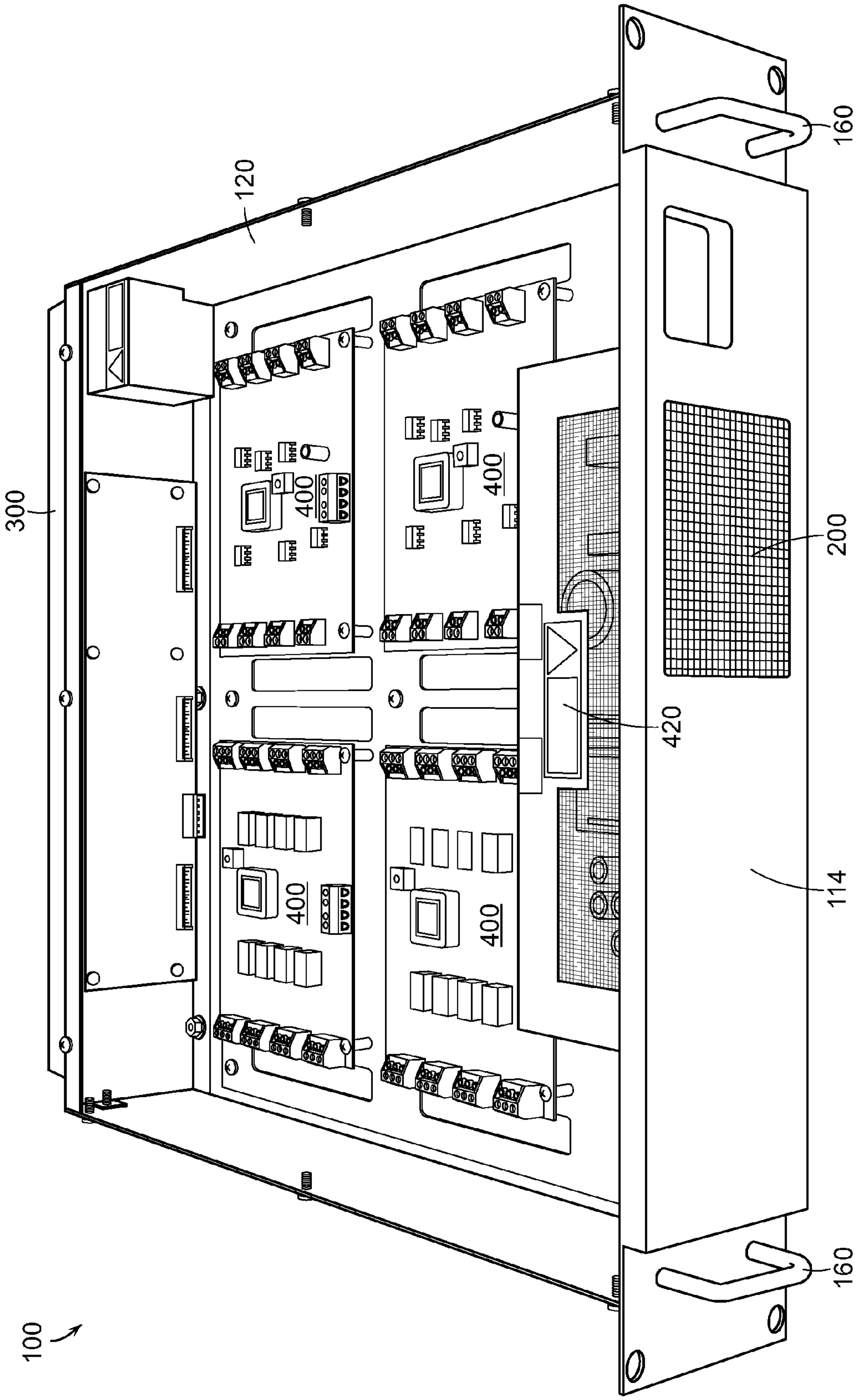
FIG. 12 depicts a rack-mounted access control panel expansion box according to one practice of the invention.

FIG. 12 depicts a rack-mounted access control panel expansion box 100 according to one practice of the invention. In the illustrated embodiment, generally, one or more expansion boxes 100 are paired with a single "main box," e.g., access control panel 10, or the like, in order to serve (i.e., provide access control to) one or more additional sensors, actuators, and/or intrusion prevention devices (collectively "additional security devices"), although in other embodiments they may be paired with multiple "main boxes." Here, the additional security devices are simple field devices in the nature of sensors, e.g., door status contacts, motion detectors, glass break detectors, etc., and actuators, e.g., lights, alarms, locks, etc., although in other embodiments the expansion box 100 may serve more complex devices as well.

More particularly, the illustrated expansion box 100 includes an enclosure 120 having a front panel 114, as shown. The enclosure 120 and front panel 114 are generally configured and operated in the manner of enclosure 12 and front panel 14, discussed above. Although the enclosure 120 is shown here with an open top-portion, those skilled in the art will appreciate that such a depiction is for illustrative purposes, and that in the illustrated embodiment, the enclosure 120 may have an enclosed top portion of the type disclosed above, e.g. in the manner of enclosure 12.

The enclosure 120 provides a rigid framework onto which mechanical, electromechanical, integrated circuit and other components (collectively, “components”) of the expansion box 100 are mounted and a housing structure that protects those components from dust, moisture, tampering, and so forth. In the illustrated embodiment, enclosure 120 comprises a metal rack-mount chassis of the type conventionally used in the digital data processor server art, the laboratory equipment art, and so forth.

The illustrated front panel 114 is affixed to a front of enclosure 120, as shown. The front panel 114, which contributes to mounting and protection of the components of the expansion box 100, also facilitates handling and rack-mounting of the expansion box 100. To these ends, illustrated expansion box 100 incorporates handles 160 and air flow apertures 200, configured as shown. Although not shown here, the expansion box 100 of the illustrated embodiment also incorporates slides (e.g., of the type shown in FIGS. 1 and 7). The handles 160 and slides facilitate sliding of the panel 10 in and out of a rack (not shown), e.g., a standard EIA twenty six inch deep electronics rack, or otherwise. Air flow apertures 200 ensure a stable operating temperature within the enclosure 120 and, in the illustrated embodiment, comprise conventional openings in the front panel 114. One or more fans could, for example, circulate air through such openings, thereby cooling the components inside the enclosure 120.

Although not shown here, in the illustrated embodiment, the enclosure 120 has an enclosed top portion, e.g., of the type shown in FIG. 1 or FIG. 7. The expansion box 100 may additionally include a hinged access port (not shown) located on the top portion of the enclosure 120, e.g., as shown in FIG. 7. In other embodiments, the access port may be located elsewhere and may be secured by mechanism(s) other than hinges. The hinged port allows, among other things, easy access to the internals of the expansion box 100.

FIG. 12 further depicts internal components of the expansion box 100. As shown, the expansion box 100 has components mounted on a base and rear panel 300 of the enclosure 120. The illustrated components include, among other things, input/output (I/O) boards 400, power supply 420, an array of connectors 320, and a connector 330, generally configured as shown.

The illustrated I/O boards 400 provide an interface for receiving and sending signals (e.g., access control signals, alerts, etc.) between an external access control panel (e.g., access control panel 10) and one or more additional security devices. The I/O boards 400 permit, among other things, the external access control panel to serve security devices additional to those directly connected to the panel, e.g., as discussed above. By way of non-limiting example, the I/O boards 400 may receive alerts from additional security devices, and send those alerts to access control panel 10 for processing. By way of further example, the I/O boards 400 may receive control signals from the control boards 40, and send those signals to the additional security devices.

Figure 13:
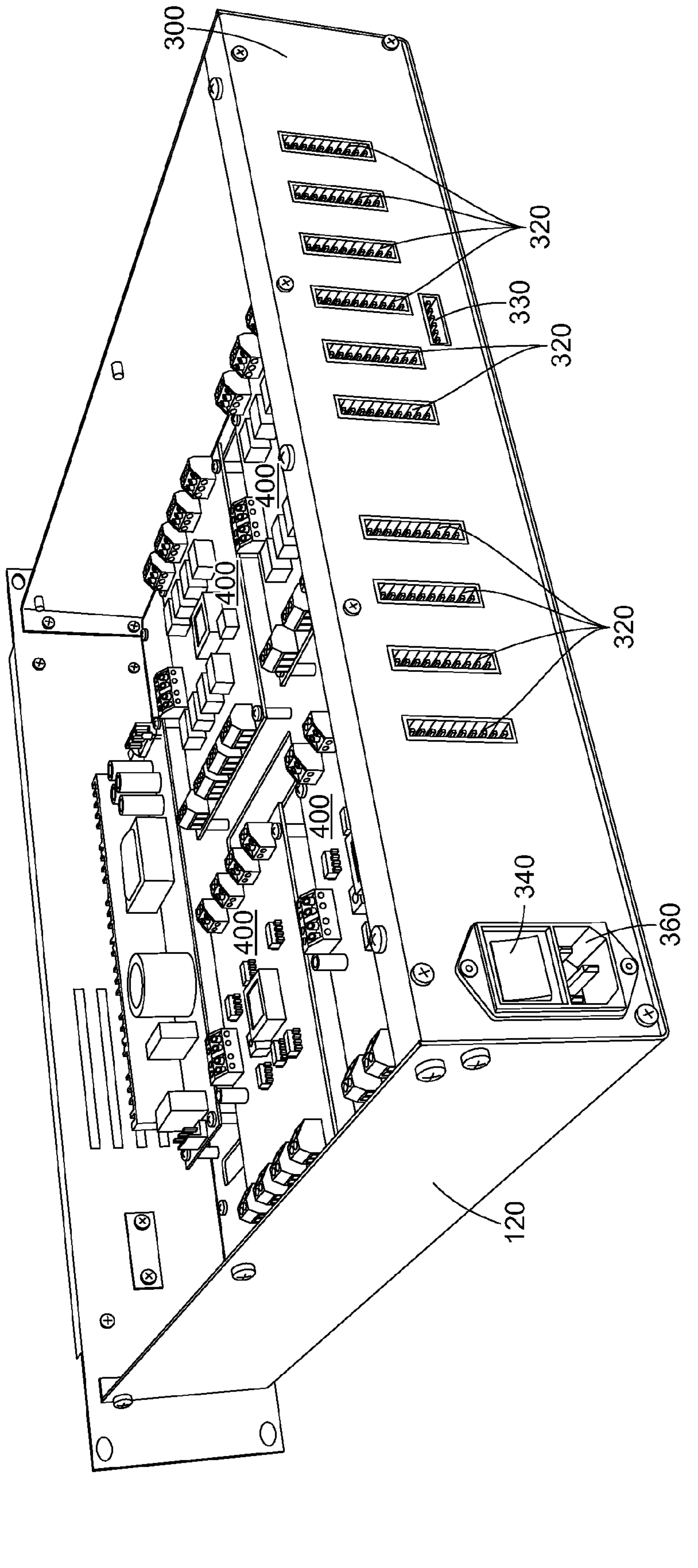
FIG. 13 depicts a rear panel of the enclosure of FIG. 12 and, more specifically, depicts a rear panel having multiple connectors.

In the illustrated embodiment, as shown in FIGS. 12 and 13, there are four I/O boards 400 disposed within enclosure 120, although in other embodiments the expansion box 100 may include a greater or lesser number of such boards 400.

With further reference to FIG. 12, the illustrated expansion box 100 includes a power supply unit 420 that supplies power to the I/O boards 400 and other components of the expansion box 100, in the conventional manner known in the art. Although the illustrated power supply 420 only powers the expansion box 100 itself, in other embodiments it may additionally power one or more attached additional security devices (for example, magnetic locks, sensors, etc.) Moreover, in other embodiments, the I/O boards 400, and the expansion box 100 generally, may be powered otherwise, e.g., via a paired external access control panel.

FIG. 13 depicts a rear panel of the rack-mounted access control panel expansion box 100 of FIG. 12. The expansion box 100 includes a rear panel 300 affixed to a rear of the enclosure 120, as shown. The illustrated rear panel 300 has a row of security device connectors 320, a single main connector 330, a power switch 340, and a power-in port 360, configured as shown.

Illustrated security device connectors 320, which are generally configured and operated in the manner of connectors 32, described above, provide communications coupling, e.g., electrical connectivity, between the I/O boards 400 (via a wiring harness of the type discussed above in reference to FIG. 6) and the aforementioned additional security devices (e.g., detectors, electrified locks, etc.). In the illustrated embodiment, each connector 320 has multiple conductors and screws, fast-locks, or other fastening devices that facilitate securing corresponding leads from cabling that lead to those additional security devices—and, thereby, establishing electrical connectivity to the I/O boards 400 (again, via a wiring harness).

To this end, connectors 320 can be selected or configured for securing leads to conventional analog or digital additional security devices. An advantage of utilization of connectors 320 (rather than wire pass-through apertures of the type incorporated in most prior-art security panels) is that the field technician, or other person installing the expansion box 100 at a site, can simply attach leads from the additional security devices to the connectors (rather than passing those leads through the panel) in order to establish coupling between the I/O boards 400 and those additional security devices.

The illustrated main connector 330 provides communications coupling between the expansion box 100, or more particularly, the I/O boards 400, and the external access control panel (e.g., access control panel 10 or the like). Such coupling permits, among other things, the access control panel to serve security devices additional to those directly connected to the panel, e.g., as discussed above. Although a single connector 330 is shown here, other embodiments may use multiple such connectors.

In the illustrated embodiment, it will be appreciated that multiple wires, cables, or the like, may be used for transfer of information (e.g., control signals, alerts, etc.) from the additional security devices to the I/O boards 400. That information may, in turn, be transferred from the I/O boards 400 to the external access control panel through a single cable (e.g., coupled via connector 330). This may be effected by encoding the received signals or otherwise, as evident to those skilled in the art. Conversely, encoded information received from the external control control panel may be decoded for application to the I/O boards and transfer to the implicated security devices.

With further reference to the drawing, power switch 340 allows a user to control the flow (e.g., “on” or “off”) of electrical power to the expansion box 100 and, in the illustrated embodiment, comprises a conventional toggle switch or otherwise. Illustrated power switch 340 is operated manually, though, in other embodiments it may be operated electronically, remotely, or otherwise.

The power-in port 360 serves as an interface between the expansion box 100 and an external power source. In the illustrated embodiment, power-in port 360 comprises an electrically wired outlet, into which a conventional power plug or cable connects.

Described above are devices and methods meeting the aforementioned objects, among others. Those skilled in the art will appreciate that the embodiments discussed and shown herein are merely examples of the invention and that other embodiments fall within the scope thereof.

In view thereof, what we claim is:

1. An access control system comprising
A. a first rack-mount enclosure in communications coupling with a second rack-mount enclosure,
B. one or more access control boards disposed within the first enclosure that
i. receive signaling from one or more sensors and/or intrusion prevention devices (collectively, "security devices"), and/or
ii. control access to one or more entry points and/or zones,
C. a plurality of input/output (I/O) boards disposed within the second enclosure that
i. receive signaling from one or more additional sensors and/or intrusion prevention devices (collectively, "additional security devices"), and send signals based on said received signaling to one or more of the control boards disposed within the first enclosure, and/or
ii. receive signaling from one or more of the control boards disposed within the first enclosure, and send signals based on said received signaling to one more of the additional security devices.

2. The access control system of claim 1, wherein at least one connector is disposed or mounted on the first enclosure providing communications coupling between at least one of the control boards and at least one of the I/O boards.

3. The access control system of claim 2, wherein the at least one connector disposed on the first enclosure provides such communication coupling without requiring that a field technician, or other person installing the system at a site, pass wire through the first enclosure in order to establish that communications coupling.

4. The access control system of claim 1, wherein at least one connector is disposed or mounted on the second enclosure providing communications coupling between at least one of the I/O boards and at least one of the additional security devices.

5. The access control system of claim 4, wherein such communications coupling is provided without requiring that a field technician, or other person installing the system at a site, pass wire through the second enclosure in order to establish that communications coupling.

6. The access control system of claim 1, wherein at least one connector is disposed or mounted on the second enclosure providing communications coupling between a plurality of I/O boards and at least one of the control boards, wherein said connector facilitates consolidating a plurality of signals received by the I/O boards for transmission to one or more of the control boards disposed within the first enclosure.

7. The access control system of claim 1, further comprising a wiring harness disposed within the second enclosure that carries communication signals from at least one connector disposed in the second enclosure to the I/O boards.

8. The access control system of claim 1, wherein the first enclosure further comprises one or more power and/or electrical interfaces that support the control boards and the sensors and/or intrusion prevention devices.

9. The access control system of claim 1, wherein the first enclosure further comprises a power unit providing power to the first enclosure and the second enclosure, and the components disposed therein.

10. The access control system of claim 1, wherein the first enclosure comprises a backplane in which one or more access control boards are mounted or disposed.

11. The access control system of claim 10, wherein the backplane comprises one or more arrangements of apertures and/or mounting pins to support mounting of the access control boards.

12. The access control system of claim 11, wherein the access control boards comprise multiple different platforms.

13. A method of access control comprising
A. coupling a first rack-mount enclosure to a second rack-mount enclosure,
B. housing one or more access control boards within the first enclosure, the access control boards
i. receiving signaling from one or more sensors and/or intrusion prevention devices (collectively, "security devices"), and/or
ii. controlling access to one or more entry points and/or zones,
C. housing a plurality of input/output (I/O) boards within the second enclosure, the I/O boards
i. receiving signaling from one or more additional sensors and/or intrusion prevention devices (collectively, "additional security devices"), and sending signals based on said receiving signaling to one or more of the control boards disposed within the first enclosure, and/or
ii. receiving signaling from one or more of the control boards disposed within the first enclosure, and sending signals based on said receiving signaling to one more of the additional security devices.

14. The method of claim 13, wherein at least one connector disposed on the first enclosure provides communication coupling between at least one of the access control boards and at least one of the additional security devices.

15. The method of claim 14, wherein the at least one connector disposed on the first enclosure provides such communication coupling without requiring that a field technician, or other person installing the system at a site, pass wire through the first enclosure in order to establish that communications coupling.

16. The method of claim 13, providing communications coupling, via at least one connector disposed or mounted on the second enclosure, between a plurality of I/O boards and at least one of the control boards, wherein said connector facilitates consolidating a plurality of signals received by the I/O boards for transmission to one or more of the control boards disposed within the first enclosure.

17. The method of claim 13, wherein the at least one connector disposed on the second enclosure provides communication coupling between at least one of the I/O boards and at least one of the additional security devices.

18. The method of claim 17, wherein the at least one connector disposed on the second enclosure provides such communications coupling without requiring that a field technician, or other person installing the system at a site, pass wire through the second enclosure in order to establish that communications coupling.

19. An access control panel comprising:
A. an enclosure,
B. one or more access control boards disposed within the enclosure that
i. receive signaling from one or more security devices, each comprising any of a sensor and/or an intrusion prevention device, and/or
ii. control access to one or more entry points and/or zones,
C. at least one connector providing communications coupling between at least one of the access control boards and at least one of the security devices, and D. wherein at least one of i. a plurality of connectors are mounted or disposed in a single row on a rear panel of the enclosure, and/or ii. the enclosure includes a hinged access port providing access to at least a component disposed within that enclosure.

20. The access control panel of claim 19, wherein the enclosure includes a removable shroud mounted on a rear portion of the enclosure, the shroud protecting at least the connectors, and/or communication couplings, from materials that can damage such components.

21. The access control panel of claim 19, wherein said at least one connector provides communication coupling between at least one of the access control boards and at least one of the security devices without requiring requiring that a field technician, or other person installing the panel at a site, pass wire through the enclosure in order to establish that communications coupling.

22. The access control panel of claim 19 comprising dual LAN ports.

23. The access control panel of claim 19, comprising a wiring harness that carries communication signals from the one or more connectors to one or more control boards.

* * * * *